US011294015B2

United States Patent
Abdishektaei et al.

(10) Patent No.: US 11,294,015 B2
(45) Date of Patent: Apr. 5, 2022

(54) METHOD AND SYSTEM FOR DEEP CONVOLUTIONAL NEURAL NET FOR ARTIFACT SUPPRESSION IN DENSE MRI

(71) Applicant: University of Virginia Patent Foundation, Charlottesville, VA (US)

(72) Inventors: Mohammad Abdishektaei, Charlottesville, VA (US); Xue Feng, Charlottesville, VA (US); Xiaoying Cai, Charlottesville, VA (US); Craig H. Meyer, Charlottesville, VA (US); Frederick H. Epstein, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 16/783,144

(22) Filed: Feb. 5, 2020

(65) Prior Publication Data

US 2020/0249306 A1   Aug. 6, 2020

Related U.S. Application Data

(60) Provisional application No. 62/801,530, filed on Feb. 5, 2019.

(51) Int. Cl.
*G01R 33/565* (2006.01)
*G06N 20/00* (2019.01)
(Continued)

(52) U.S. Cl.
CPC ..... *G01R 33/56554* (2013.01); *G01R 33/482* (2013.01); *G01R 33/56509* (2013.01); *G06N 3/08* (2013.01); *G06N 20/00* (2019.01)

(58) Field of Classification Search
CPC ........ G01R 33/56554; G01R 33/56509; G01R 33/482; G01R 33/5608; G01R 33/565;
(Continued)

(56) References Cited

U.S. PATENT DOCUMENTS

2019/0279361 A1* 9/2019 Meyer ................... G06T 7/0012
2019/0302210 A1  10/2019 Epstein et al.
2019/0302211 A1  10/2019 Cai

OTHER PUBLICATIONS

Gilliam, Andrew D., and Frederick H. Epstein. "Automated motion estimation for 2-D cine DENSE MRI." IEEE transactions on medical imaging 31.9 (2012): 1669-1681.
(Continued)

*Primary Examiner* — Susan S Lee
(74) *Attorney, Agent, or Firm* — Meunier Carlin & Curfman LLC

(57) ABSTRACT

Suppressing artifacts in MRI image acquisition data includes alternatives to phase cycling by using a Convolutional Neural Network to suppress the artifact-generating echos. A U-NET CNN is trained using phase-cycled artifact-free images for ground truth comparison with received displacement encoded stimulated echo (DENSE) images. The DENSE images include data from a single acquisition with both stimulated (STE) and T1-relaxation echoes. The systems and methods of this disclosure are explained as generating artifact-free images in the ultimate output and avoiding the additional data acquisition needed for phase cycling and shortens the scan time in DENSE MRI.

19 Claims, 12 Drawing Sheets

(51) Int. Cl.
 *G06N 3/08* (2006.01)
 *G01R 33/48* (2006.01)
(58) Field of Classification Search
 CPC .... G01R 33/56325; G06N 20/00; G06N 3/08;
 G06N 3/0454
 See application file for complete search history.

(56) References Cited

OTHER PUBLICATIONS

Simpson, Robin M., Jennifer Keegan, and David N. Firmin. "MR assessment of regional myocardial mechanics." Journal of Magnetic Resonance Imaging 37.3 (2013): 576-599.
Spottiswoode, Bruce S., et al. "Motion-guided segmentation for cine DENSE MRI." Medical image analysis 13.1 (2009): 105-115.
Spottiswoode, Bruce S., et al. "Tracking myocardial motion from cine DENSE images using spatiotemporal phase unwrapping and temporal fitting." IEEE transactions on medical imaging 26.1 (2006): 15-30.
Xu, Wei, and Ian Cumming. "A region-growing algorithm for InSAR phase unwrapping." IEEE transactions on geoscience and remote sensing 37.1 (1999): 124-134.
Young, A. A. et al., "Generalized Spatiotemporal Myocardial Strain Analysis for DENSE and SPAMM Imaging", Magnetic Resonance in Medicine 2012, 67(6): 1590-1599.

* cited by examiner

METHOD AND SYSTEM FOR DEEP CONVOLUTIONAL NEURAL NET FOR ARTIFACT SUPPRESSION IN DENSE MRI

CROSS-REFERENCE TO RELATED APPLICATION

This application claims priority to and benefit under 35 U.S.C § 119(e) of U.S. Provisional Patent Application Ser. No. 62/801,530 entitled "Method and System for Deep Convolution Neural Net for Artifact Suppression in DENSE MRI" filed Feb. 5, 2019, which is hereby incorporated by reference herein in its entirety as if fully set forth below.

FIELD

The present disclosure relates to magnetic resonance imaging (MRI) operations that, according to some aspects, can utilize phase unwrapping methodologies that fully automate DENSE (Displacement Encoding with Stimulated Echoes) analyses methods, among other magnetic resonance phase encoded data sets, to provide MRI images having suppressed artifact images across numerous imaging domains.

BACKGROUND

The present disclosure generally relates to the field of medical imaging for analysis of certain physiological activities of a subject. For example, and without limiting this disclosure, various conventional imaging techniques can provide for an assessment of the heart with regard to spatial coverage. Two-dimensional (2D), three-dimensional (3D), and "cine" data measurements can provide a complete assessment of the heart with regard to spatial coverage and a comprehensive evaluation of certain areas such as the strain tensor.

Basic MRI technology standards discussed in this disclosure are also set forth in co-pending U.S. application Ser. No. 16/369,700 (Epstein et al.), published as U.S. 20190302210, which is incorporated by reference in its entirety as if set forth fully herein. The Epstein '210 publication discusses phase-contrast displacement encoding that has been used for myocardial imaging, and cine DENSE (Displacement Encoding with Stimulated Echoes) imaging, which has emerged as a strain imaging technique that can offer high spatial resolution, equivalent accuracy, better reproducibility, and where strain analysis is less time consuming ([1], [2], [3]). DENSE can also provide quantification of numerous features from myocardial tissue, where tissue displacement is encoded as a phase of a stimulated-echo signal (STE). In one embodiment of the Epstein '210 disclosure, a non-transitory computer-readable medium has stored instructions that, when executed by one or more processors, cause a computing device to perform functions of a method of acquiring magnetic resonance data associated with a physiological activity in an area of interest of a subject, where the acquired magnetic resonance data includes one or more phase-encoded data sets. The method, configured in software, also determines, from at least the one or more phase-encoded data sets, an output data set (e.g., displacement-encoded information) corresponding to the physiological activity in the area of interest. Reconstruction of the images showing all of this work includes performing phase unwrapping of the phase-encoded data set using region growing along multiple pathways based on phase predictions.

It is notable that MRI imaging encompasses techniques such as acquisition of "cine images." Cine images are short movies that are able to show heart motion throughout the cardiac cycle, in short-axis. For example, measurement of left ventricular (LV) mass, ejection fraction, percentage of LV mass subtended by scar, and extracellular volume may be some of the heart tissue qualities studied with cine data. Cine DENSE, therefore, measures myocardial displacements by encoding tissue displacement into the signal phase. Displacement encoding frequencies ($k_e$) are selected to balance signal-to-noise ratio, displacement sensitivity, and artifact suppression [4], resulting in phase wrapping during systole. Spatio-temporal phase unwrapping is required to compute Lagrangian motion trajectories and strain [4] [5]. Phase unwrapping may be aided by delineating the myocardium using manually-defined contours [2]. Displacement encoding with stimulated echoes (DENSE), therefore, may be described as tools that measure myocardial displacements using the signal phase. Current DENSE analysis methods are aided by user-defined myocardial contours.

Even in light of the achievements in magnetic resonance imaging set forth in earlier patent publications, many MRI images include artifacts that users would like to suppress. For example, as shown in FIG. 1, when displacement is encoded into the phase of a Stimulated Echo (STE), an additional undesired echo is simultaneously being acquired along with the STE due to T1-relaxation. T1-relaxation echo generates striping artifacts in the image domain that practitioners would prefer to avoid. This is one area of inquiry addressed herein.

Along those lines, commonly owned and co-pending U.S. patent application Ser. No. 16/368,218 (Cai), published as United States Patent Publication No. 2019/0302211, illustrates one prior art example of artifact suppression. The Cai '211 publication is incorporated by reference herein as if fully set forth in this disclosure. In one aspect, the Cai disclosure relates to a method of acquiring magnetic resonance imaging data for a plurality of images of a subject, wherein the plurality of images include respectively phase-cycled interleaves of the imaging data that populate a respective segment of the images. The Cai '211 methodology includes calculating residual T1 energy values for each of the images. In one embodiment, the method includes selecting a first image and a second image as a first matched pair of images, wherein the first matched pair of images has a lowest average of corresponding residual T1 energy values in comparison to other unselected pairs of the images. In accordance with the method, the Cai disclosure includes subtracting the first image from the second image to suppress artifacts within a resulting image and using the resulting image to reconstruct an image-based navigator (iNav) for the segment, wherein the iNav includes stimulated-echo images with suppressed artifacts (ste-iNAVs).

Even in light of the earlier technologies, a need in the art of MRI data acquisition and display continues to exist in terms of suppressing artifacts without requiring such computer intensive, time consuming, and repetitive operations that are notable in the prior art. This disclosure investigates and discloses methods and systems for suppressing artifacts in MRI images, including but not limited to the above noted T1 relaxation echo, with a single pass through a convolutional neural network (CNN) to address these ongoing needs for image clarity in the industry.

SUMMARY

Other aspects and features according to the example embodiments of the disclosed technology will become apparent to those of ordinary skill in the art, upon reviewing the following detailed description in conjunction with the accompanying figures.

In one embodiment, a method of using a convolutional neural network (CNN) to separate signals and suppress artifacts in MRI images includes the steps of acquiring first data comprising a stimulated echo and a T1 relaxation echo; acquiring second data comprised of a second stimulated echo, a second T1 relaxation echo, and a second stimulated anti-echo; acquiring at least one of original frames comprising the stimulated echo and the T1 relaxation echo; acquiring at least one of additional original frames comprising a stimulated echo, a T1 relaxation echo, and a stimulated anti-echo; and acquiring a plurality of new original frames of displacement encoded stimulated echo (DENSE) cine frames of MRI image data of a subject. The CNN is trained by selecting a training set of complex image data from the original frames, additional original frames, and/or the new additional frames. The method continues by computing ground-truth complex image data from the training set. The training as set forth herein includes training the CNN by applying the training set of complex image data to train the CNN and calculating a two-channel training output of complex output image data. Using the complex output image data and the ground truth complex image data, the method is used for calculating a loss function as training feedback to establish a trained CNN. The trained CNN may be used for testing the trained CNN by selecting a testing set of complex input image data from the original frames, additional original frames, and/or the new additional frames and applying the testing set of complex input image data to the trained CNN. Receiving a two-channel set of testing output complex image data indicates an output with suppressed artifacts. Computerized systems may be utilized to implement the method steps of this disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Reference will now be made to the accompanying drawings, which are not necessarily drawn to scale.

DETAILED DESCRIPTION

Figure 1:
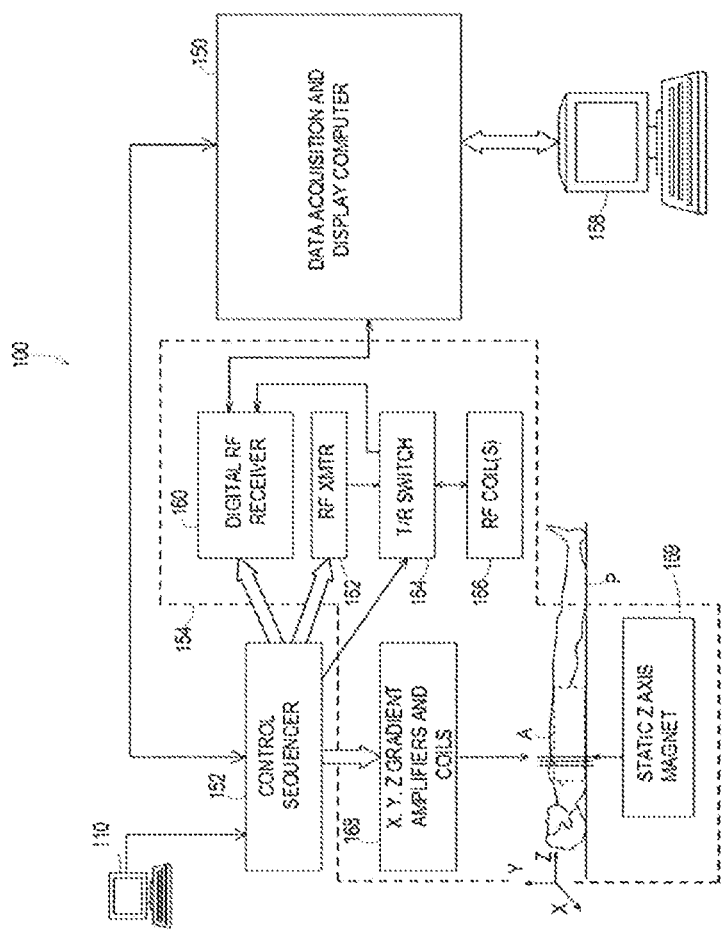
FIG. 1 is a system diagram illustrating an operating environment capable of implementing aspects of this disclosure.

Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the list. For example, [6] refers to the 6th reference in the list, namely Xu, W. et al., IEEE Transactions on Geoscience and Remote Sensing 1999, 37:124-34. All references cited and discussed in this specification are incorporated herein by reference in their entireties and to the same extent as if each reference was individually incorporated by reference.

In the following description, references are made to the accompanying drawings that form a part hereof and that show, by way of illustration, specific embodiments or examples. In referring to the drawings, like numerals represent like elements throughout the several figures.

FIG. 1 is a system diagram illustrating an operating environment capable of implementing aspects of the present disclosure of automated DENSE analysis in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158. The display 158 may be implemented through a variety of output interfaces, including a monitor, printer, or data storage.

The area of interest "A" corresponds to a region associated with one or more physiological activities in patient "P". The area of interest shown in the example embodiment of FIG. 1 corresponds to a chest region of patient "P", but the area of interest for purposes of implementing aspects of the disclosure presented herein is not limited to the chest area. It should be recognized and appreciated that the area of interest can be one or more of a brain region, heart region, and upper or lower limb regions of the patient "P", for example.

It should be appreciated that any number and type of computer-based medical imaging systems or components, including various types of commercially available medical imaging systems and components, may be used to practice certain aspects of the present disclosure. Systems as described herein with respect to example embodiments are not intended to be specifically limited to magnetic resonance imaging (MRI) implementations or the particular system shown in FIG. 1.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
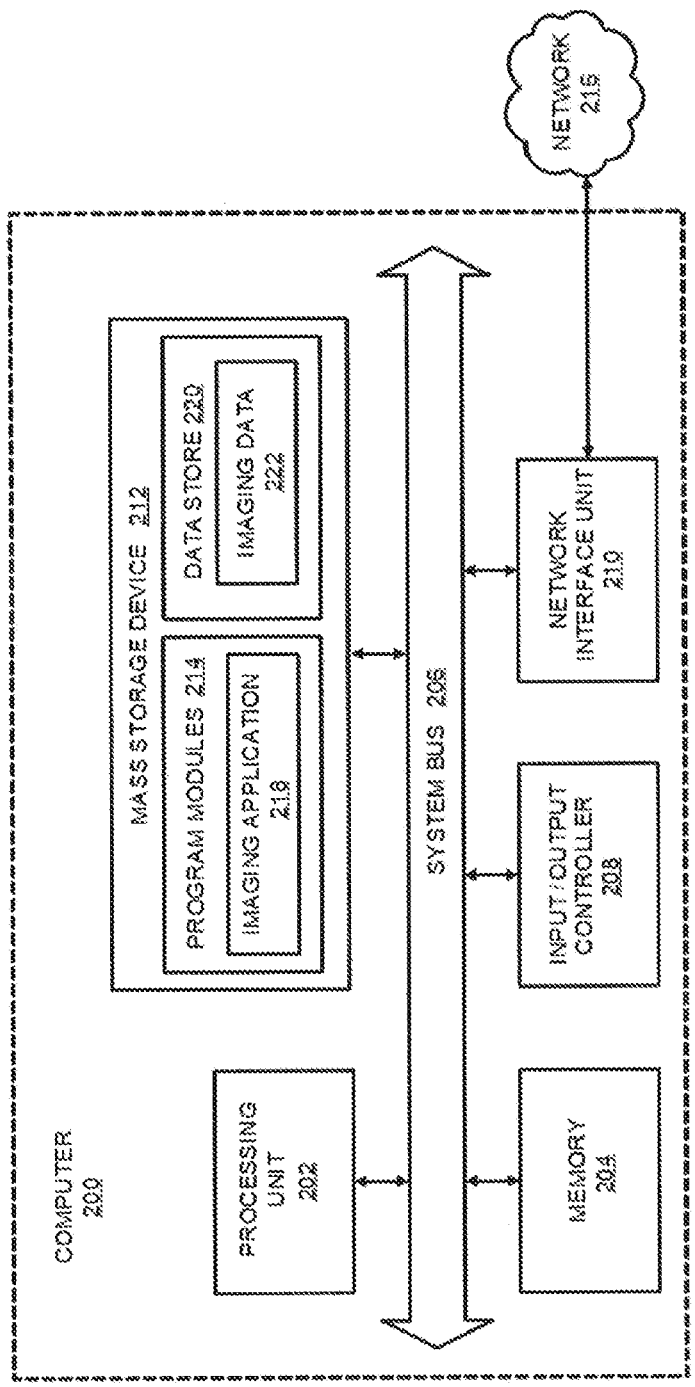
FIG. 2 is a computer architecture diagram showing a general computing system capable of implementing aspects of this disclosure.

FIG. 2 is a computer architecture diagram showing a general computing system capable of implementing aspects of the present disclosure in accordance with one or more embodiments described herein. A computer 200 may be configured to perform one or more functions associated with embodiments of this disclosure. For example, the computer 200 may be configured to perform operations of the method as described below. It should be appreciated that the computer 200 may be implemented within a single computing device or a computing system formed with multiple connected computing devices. The computer 200 may be configured to perform various distributed computing tasks, which may distribute processing and/or storage resources among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform one or more functions associated with embodiments of method as illustrated in one or more of the figures of this disclosure, for example to cause the computer 200 to perform operations of the automated DENSE analysis as described below. The program modules 214 may include an imaging application 218 for performing data acquisition functions as described herein, for example to receive image data corresponding to magnetic resonance imaging of an area of interest. The computer 200 can include a data store 220 for storing data that may include imaging-related data 222 such as acquired image data, and a modeling data store 224 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media (also referred to herein as a "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. Transitory signals are not "computer-storage media", "computer-readable storage medium" or "computer-readable storage media" as described herein.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency network, a Bluetooth-enabled network, a Wi-Fi enabled network, a satellite-based network, or other wired and/or wireless networks for communication with external devices and/or systems. The computer 200 may also include an input/output controller 208 for receiving and processing input from a number of input devices. Input devices may include one or more of keyboards, mice, stylus, touchscreens, microphones, audio capturing devices, or image/video capturing devices. An end user may utilize such input devices to interact with a user interface, for example a graphical user interface, for managing various functions performed by the computer 200.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer-storage media may also represent secondary storage, whether implemented as hard drives or otherwise. Hard drive implementations may be characterized as solid state or may include rotating media storing magnetically-encoded information. The program modules 214, which include the imaging application 218, may include instructions that, when loaded into the processing unit 202 and executed, cause the computer 200 to provide functions associated with embodiments illustrated herein. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

The computing system can include clients and servers. A client and server are generally remote from each other and generally interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware can be a design choice. Below are set out hardware (e.g., machine 300) and software architectures that can be deployed in example embodiments.

The machine 300 can operate as a standalone device or the machine 300 can be connected (e.g., networked) to other machines. In a networked deployment, the machine 300 can operate in the capacity of either a server or a client machine in server-client network environments. In an example, machine 300 can act as a peer machine in peer-to-peer (or other distributed) network environments. The machine 300 can be a personal computer (PC), a tablet PC, a set-top box (STB), a Personal Digital Assistant (PDA), a mobile telephone, a web appliance, a network router, switch or bridge, or any machine capable of executing instructions (sequential or otherwise) specifying actions to be taken (e.g., performed) by the machine 300. Further, while only a single machine 300 is illustrated, the term "machine" shall also be taken to include any collection of machines that individually or jointly execute a set (or multiple sets) of instructions to perform any one or more of the methodologies discussed herein.

Example machine (e.g., computer system) 300 can include a processor 302 (e.g., a central processing unit (CPU), a graphics processing unit (GPU) or both), a main memory 304 and a static memory 306, some or all of which can communicate with each other via a bus 308. The machine 300 can further include a display unit 310, an alphanumeric input device 312 (e.g., a keyboard), and a user interface (UI) navigation device 311 (e.g., a mouse). In an example, the display unit 810, input device 317 and UI navigation device 314 can be a touch screen display. The machine 300 can additionally include a storage device (e.g., drive unit) 316, a signal generation device 318 (e.g., a speaker), a network interface device 320, and one or more sensors 321, such as a global positioning system (GPS) sensor, compass, accelerometer, or other sensor. The storage device 316 can include a machine readable medium 322 on which is stored one or more sets of data structures or instructions 324 (e.g., software) embodying or utilized by any one or more of the methodologies or functions described herein. The instructions 324 can also reside, completely or at least partially, within the main memory 304, within static memory 306, or within the processor 302 during execution thereof by the machine 300. In an example, one or any combination of the processor 302, the main memory 304, the static memory 306, or the storage device 316 can constitute machine readable media. While the machine readable medium 322 is illustrated as a single medium, the term "machine readable medium" can include a single medium or multiple media (e.g., a centralized or distributed database, and/or associated caches and servers) that configured to store the one or more instructions 324. The term "machine readable medium" can also be taken to include any tangible medium that is capable of storing, encoding, or carrying instructions for execution by the machine and that cause the machine to perform any one or more of the methodologies of the present disclosure or that is capable of storing, encoding or carrying data structures utilized by or associated with such instructions. The term "machine readable medium" can accordingly be taken to include, but not be limited to, solid-state memories, and optical and magnetic media.

Specific examples of machine readable media can include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magnetooptical disks; and CD-ROM and DVD-ROM disks. The instructions 324 can further be transmitted or received over a communications network 326 using a transmission medium via the network interface device 320 utilizing any one of a number of transfer protocols (e.g., frame relay, IP, TCP, UDP, HTTP, etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., IEEE 802.11 standards family known as Wi-Fi®, IEEE 802.16 standards family known as WiMax®), peer-to-peer (P2P) networks, among others. The term "transmission medium" shall be taken to include any intangible medium that is capable of storing, encoding or carrying instructions for execution by the machine, and includes digital or analog communications signals or other intangible medium to facilitate communication of such software.

Figure 4:
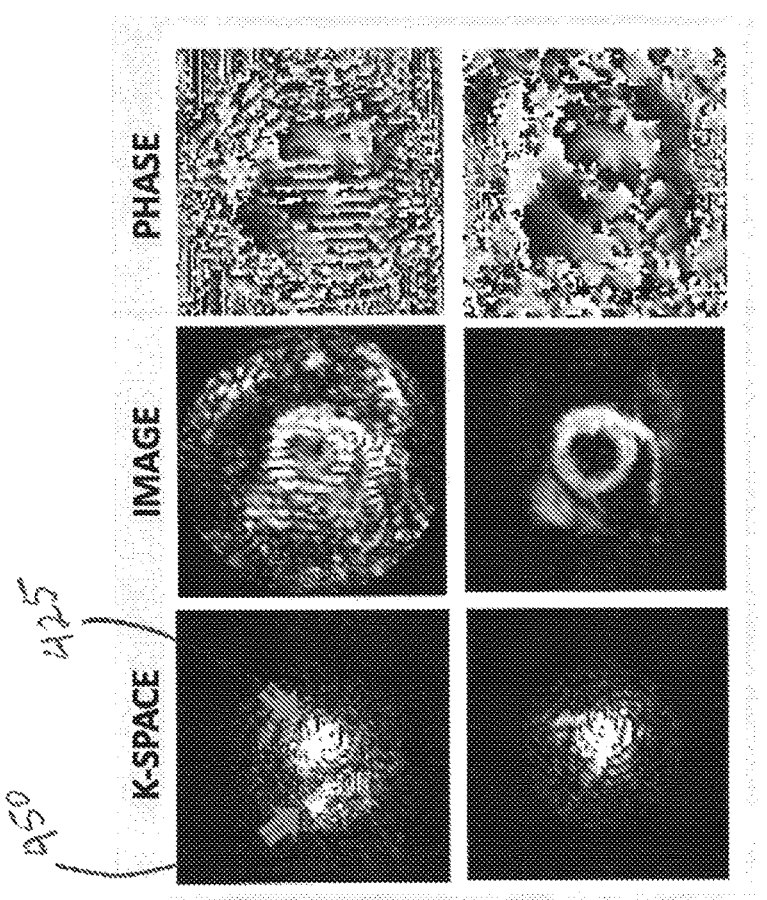
FIG. 4 illustrates an example of DENSE Image (first row) with stimulated echo (green arrow) and T1 relaxation echo (red arrow) represented in k-space and image domains. Striping artifacts can be seen in the image and phase map. The second row shows artifact-free version of the same image. T1 relaxation echo generates striping artifacts in the image domain.
Figure 3:
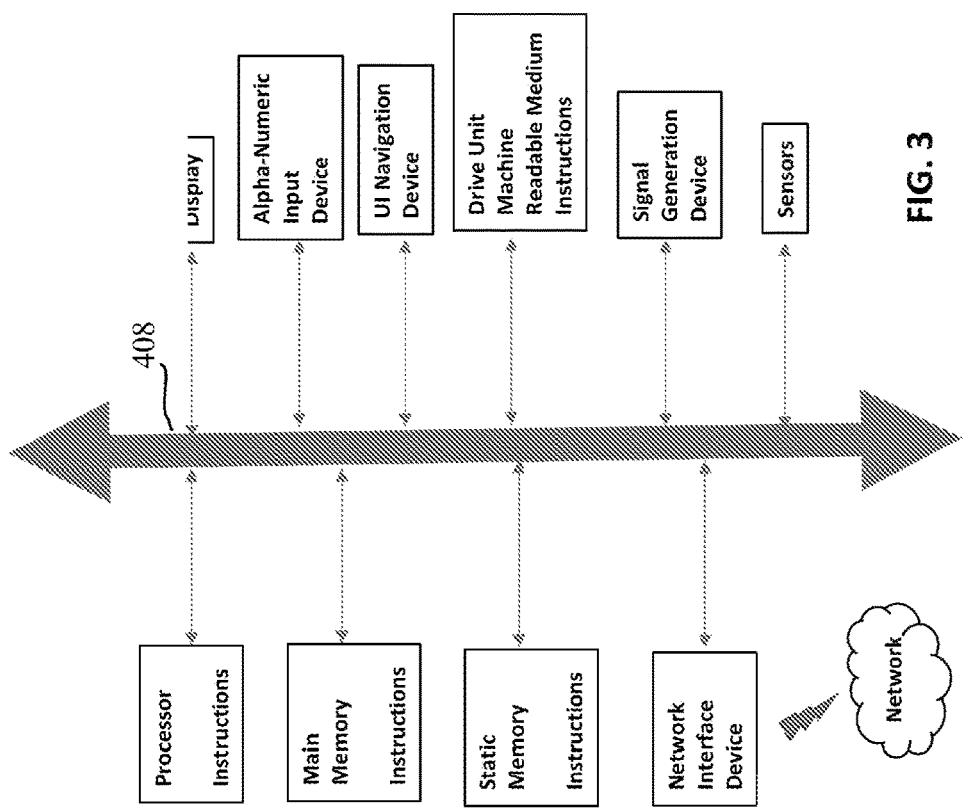
FIG. 3 is a network diagram illustrating how data acquired and processed by the systems and methods of this disclosure may be transmitted and received remotely.

In one general, non-limiting embodiment, this disclosure introduces a Convolutional Neural Network (CNN) approach to suppressing artifact-generating signals in Stimulated Echo MRI. As set forth herein, one example uses image data acquired as "cine data" described as a video/movie kind of image acquisition. Displacement Encoding with Stimulated Echoes (DENSE) is used herein as one, non-limiting instance of stimulated MRI data acquisition and provides an accurate and reproducible measure of tissue displacement. DENSE takes the advantage of phase memory property of stimulated echoes (STEs) 425 and encodes the displacement information into the phase stimulated echoes. During the DENSE acquisitions, however, another signal 450 due to the T1-relaxation of magnetization is acquired which generates artifacts and should be suppressed. [FIG. 4].

Figure 7:
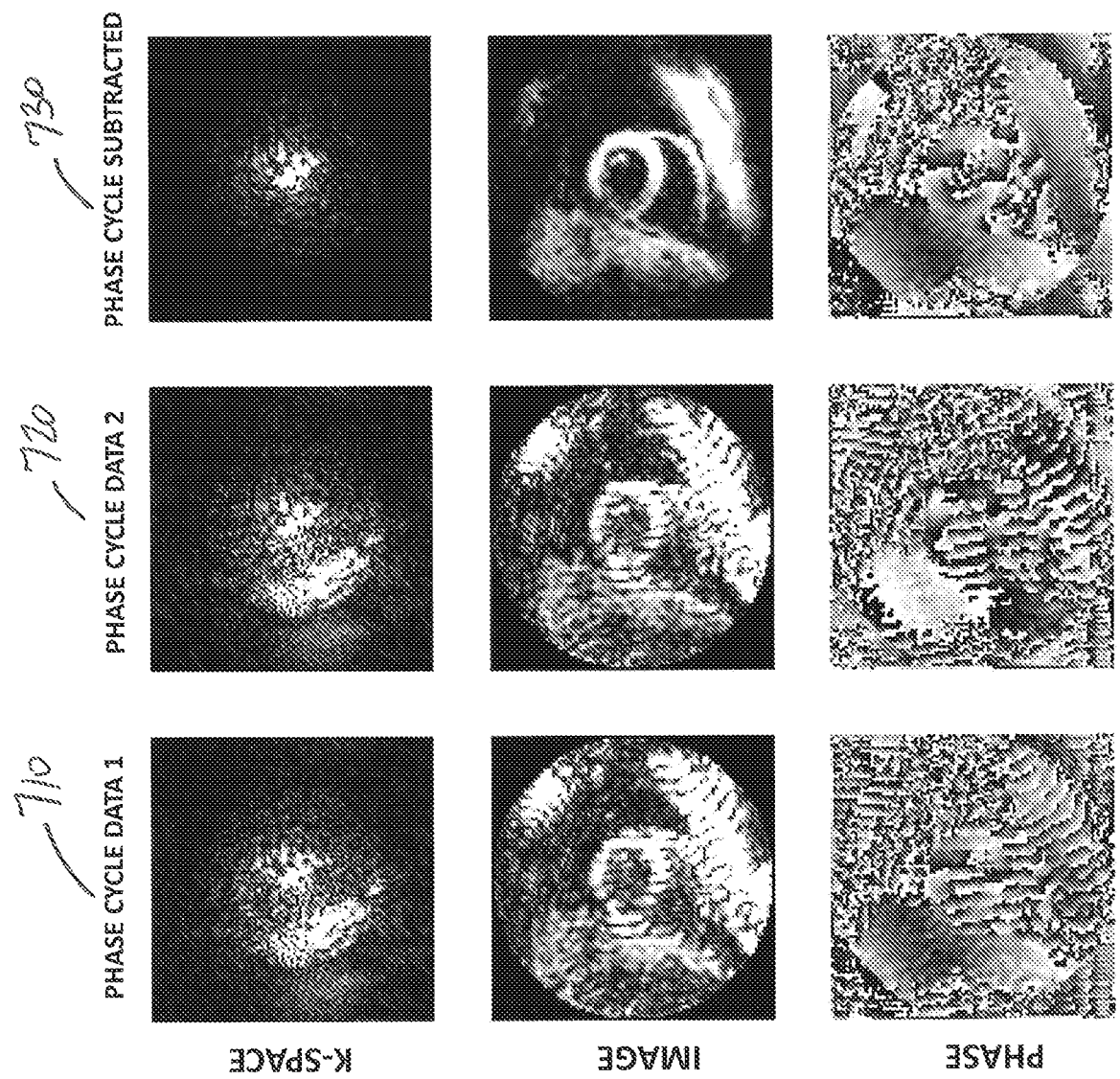
FIG. 7 illustrates a second acquisition through phase cycling and enables the suppression of the T1-relaxation echo. The STE of phase-cycling acquisition is 180 degrees out of phase; hence by subtractive and additive techniques, the second echo can be suppressed.

As described above, phase-cycling acquisition, as shown by example in FIG. 7, is a conventional method of suppressing the T1-relaxation echoes. Phase cycling involves acquisition of two sets 710, 720 of DENSE data. Subtracting the two acquired data sets results in suppression of T1-relaxation echoes as shown in output frames 730. This process, as described above, however, does involve duplicate data acquisition steps to allow for subtraction and addition processes for artifact suppression.

Figure 5:
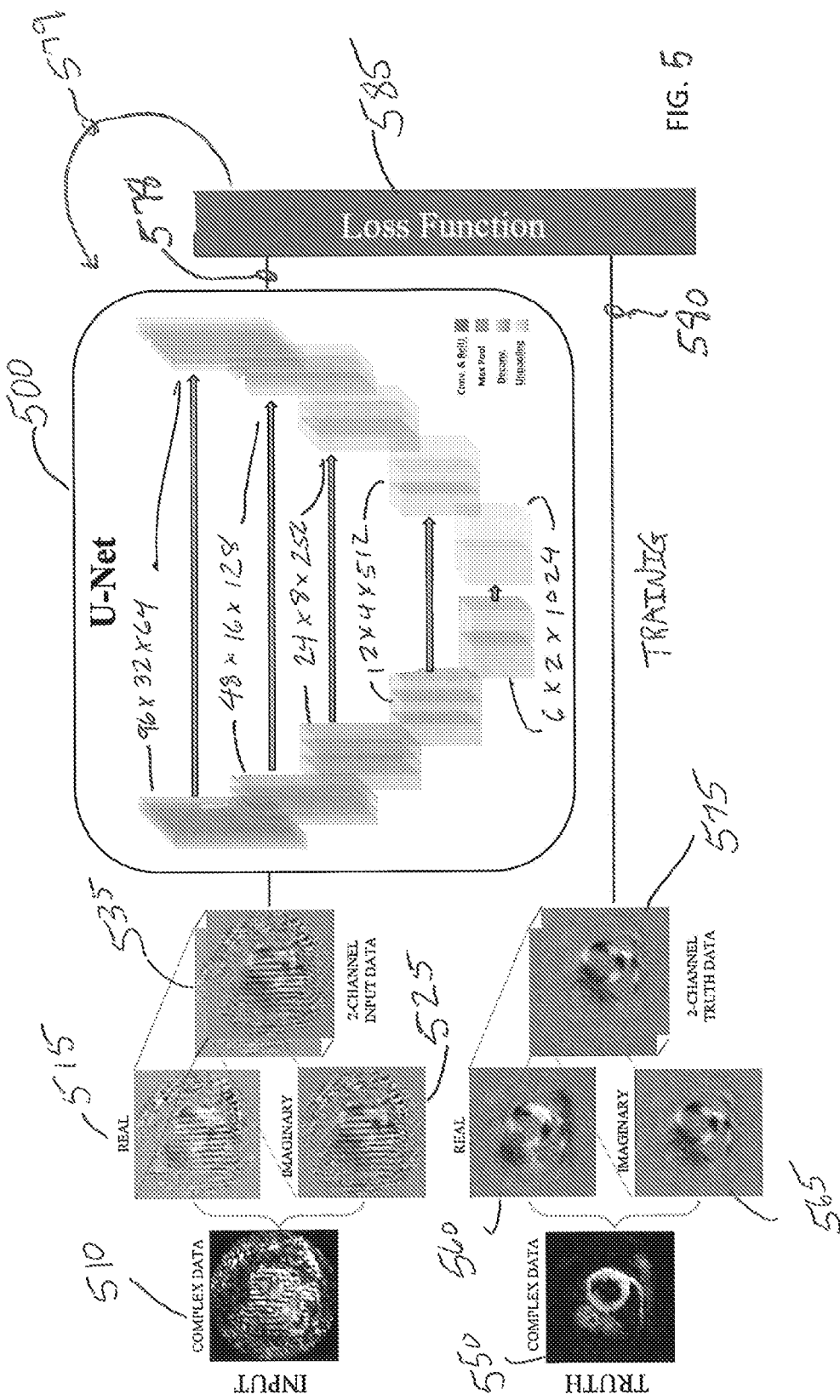
FIG. 5 illustrates a schematic representation of a U-Net convolutional neural network used as a training network according to this disclosure.
Figure 6:
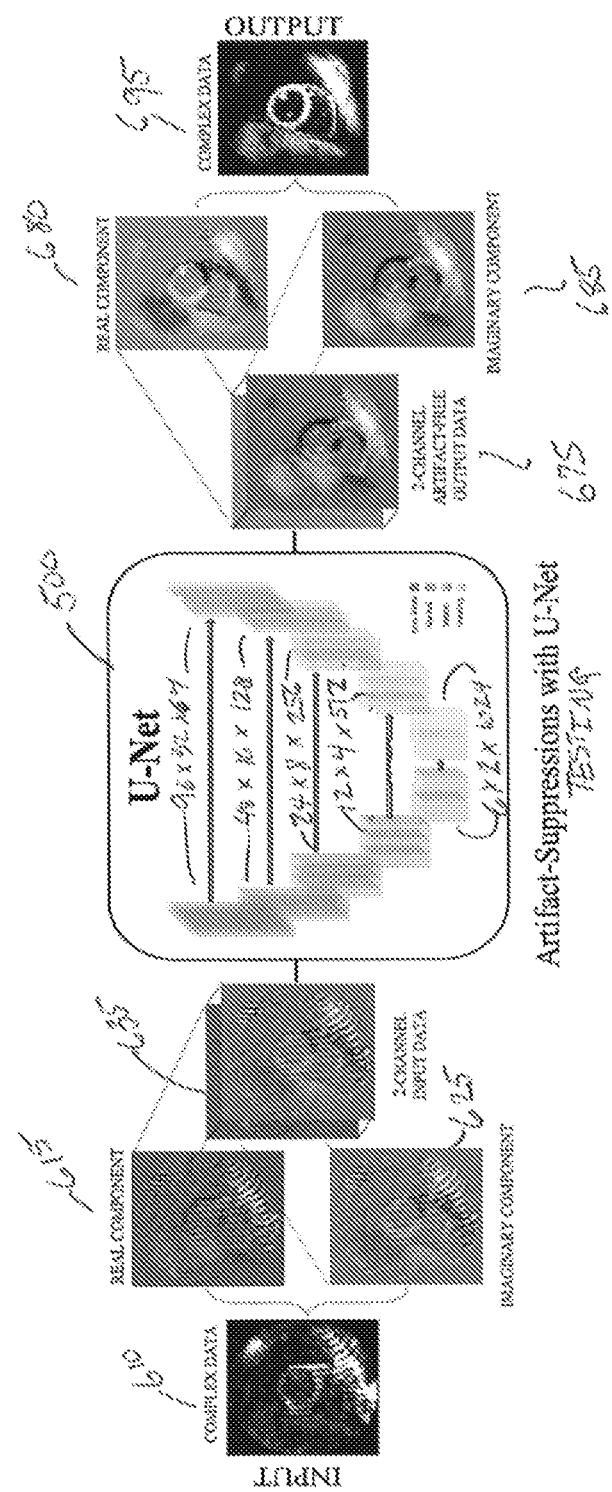
FIG. 6 illustrates a schematic representation of a U-Net convolutional neural network used as a testing network, i.e., a live artifact suppression network, according to this disclosure.

This new disclosure presents an alternative approach using a Convolutional Neural Network as shown in FIGS. 5 and 6 to suppress the artifact-generating echo. In one non-limiting example, a U-Net of FIGS. 5 and 6 is trained using phase-cycled artifact-free images 550 for ground truth comparison with received DENSE images 510. In one embodiment, the DENSE images include data from a single acquisition with both stimulated (STE) and T1-relaxation echoes. The systems and methods of this disclosure are explained as generating artifact-free images in the ultimate output 695 of FIG. 6. This avoids the additional data acquisition needed for phase cycling and shortens the scan time in DENSE MRI.

In the example shown herein, to train the U-Net, the single acquisition DENSE data 515, 525 was used as the input and the phase-cycled artifact-free data 560, 565 was used as ground-truth. The complex DENSE data were sliced into complex planes 510, 550. Then the complex planes were converted into two channel real-valued data 535, 575 before plugging into the U-Net 500 for training. [FIGS. 5-6]. After the training, the single acquisition DENSE data with containing both stimulated and T1-relaxation echoes are passed through the network and the output 695 of the network is artifact-free DENSE data where stimulated echo was isolated. [FIG. 6].

In one example embodiment, a method of using a convolutional neural network (CNN) 500 separates identified signals from acquired image data sets and suppresses artifacts in resulting output MRI images. The MRI data acquisitions that can be used with the systems and methods of this disclosure include, but are not limited to, acquiring a first set of data having a stimulated echo and a T1 relaxation echo; acquiring a second set of data having a second stimulated echo, a second T1 relaxation echo, and a second stimulated anti-echo (also called a conjugate stimulated echo). The acquired data may be organized as frames of image data in accordance with medical industry standards. In this sense, the methods and systems of this disclosure utilize at least one of the steps of acquiring at least one set of original frames comprising the stimulated echo and the T1 relaxation echo; acquiring at least one set of additional original frames comprising a stimulated echo, a T1 relaxation echo, and a stimulated anti-echo; and/or acquiring a set of a plurality of new original frames of displacement encoded stimulated echo (DENSE) cine frames of MRI image data of a subject. In this regard, the methods and systems of this disclosure are adaptable to frames of image data that include numerous combinations of desirable and undesirable image portions. After establishing the frames of data to be subject to artifact suppression, this disclosure explains how a convolutional neural network (CNN) 500 can be trained and then used to accept the image data, organized according to numerous domains, for processing to minimize or eliminate unwanted artifacts.

As shown in the figures generally, this disclosure includes steps, often implemented in computerized software and associated hardware systems, for training as shown in FIG. 5 that selects a training set of complex image data 510 from original frames of MRI data. Depending on the content of the original MRI data expressed above, this disclosure also refers to the above noted "additional" original frames, and/or the "new additional" frames, all of which may be used with this procedure. The CNN 500 of this disclosure includes ground truth data 550 that has been calculated by computing ground-truth complex image data from the training set, typically but not exclusively, with phase cycling techniques commonly used for artifact suppression. The ground truth frames, which are complex image data 550, establish the goal images that the CNN uses to compare to its output, identify error or loss function 585, and then adjust the CNN algorithms accordingly.

The CNN used to provide updated, suppressed artifact images may be a U-Net as shown in the figures that has been iteratively trained by working through cycles of training data compared to ground truth data that improves the performance of the U-Net over time. In one non-limiting embodiment, training the CNN includes applying a training set of complex image data 510 to the CNN 500 and calculating a two-channel training output of complex output image data 578 as shown in FIG. 5. The complex output image data 578 and previously calculated ground truth complex image data 580 are used to calculate a loss function as training feedback to establish a trained CNN. The loss function 585 can take many forms (root mean square error and the like) and when fed back to the CNN provides continuously updated artificial intelligence to the CNN over time.

The figures also show how the trained CNN 500 can be used for suppressing artifacts on live data, or test data, as the case may be. The artifact-suppressed output 695 shown in this disclosure at FIG. 6 is achieved, in part, by selecting a testing set of complex input image data 610 from the original frames, additional original frames, and/or the new additional frames (as available) and applying the testing set of complex input image data to the trained CNN. The figures illustrate how the output of the CNN is configured so that a user receives a two-channel set 675 of testing output complex image data with suppressed artifacts. The two-channel output 675 may be considered as having a real component 680 and an imaginary component 685. The final output may be viewed in various domains as artifact suppressed images 695.

This disclosure explains how artifact suppression described herein is achieved on phase data included within the formats described above, i.e., in complex image data. For clarity, and without limiting this disclosure, the above referenced training set of image data 510 includes imaginary component training data frames 525 and real component training data frames of 515 the complex image data. Similarly, the ground truth complex image data 550 includes imaginary component ground truth data frames 565 and real component ground truth data frames 560. The two-channel output 578 includes real output image data and imaginary output image data. The testing set 610 of FIG. 6 includes imaginary component test data frames 625 and real component test data frames 615 of the complex image data 610. The test output complex image data includes imaginary component test output data frames 685 and real component test output data frames 680. The ultimate artifact suppressed output image is shown in FIG. 6 at 695 as complex data as well.

Figure 8:
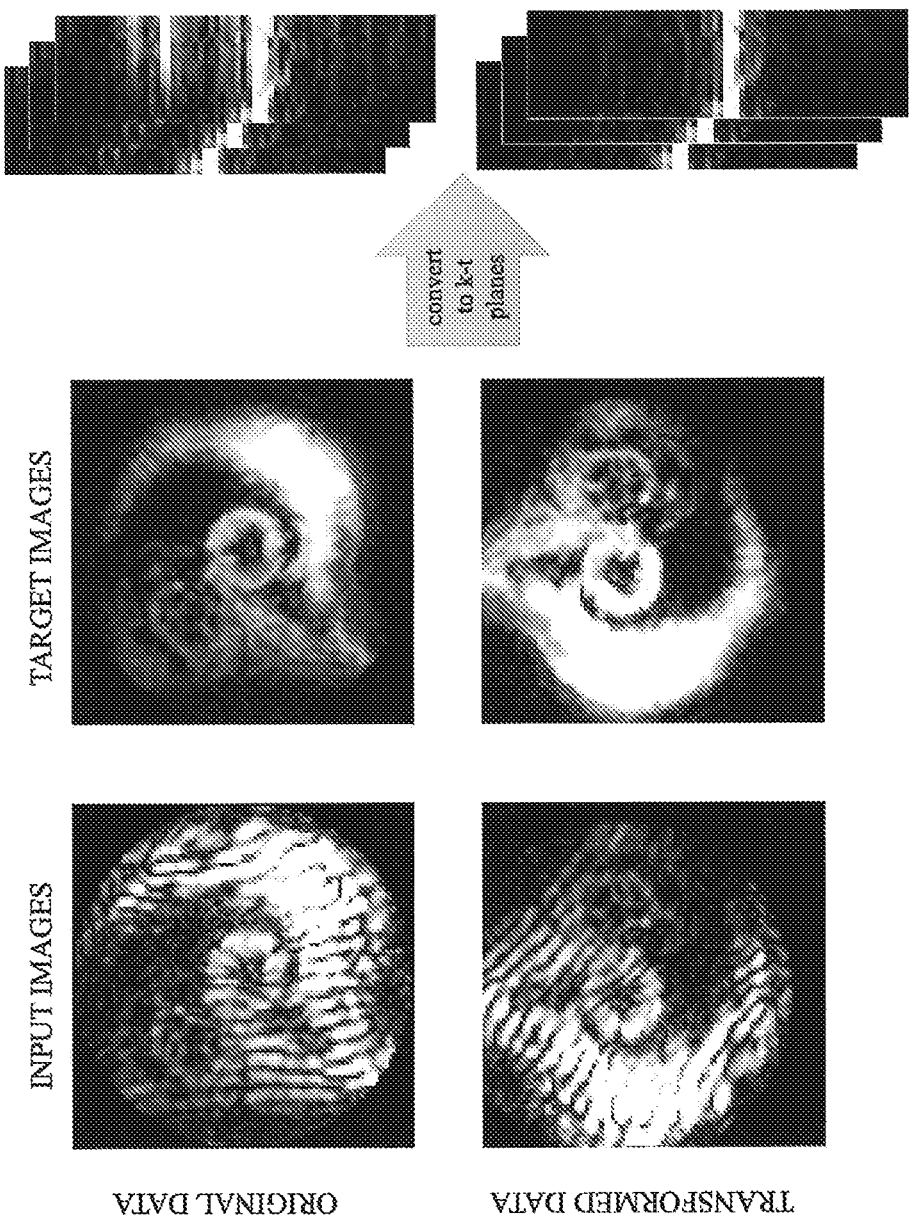
FIG. 8 illustrates one example of data pre-processing techniques as may be optionally used in the methods and systems of this disclosure, including data augmentation, spatial transformation (translation and rotation) in a k-t plane that was re-shaped into 2-channel data (real and imaginary parts of complex image data).
Figure 9:
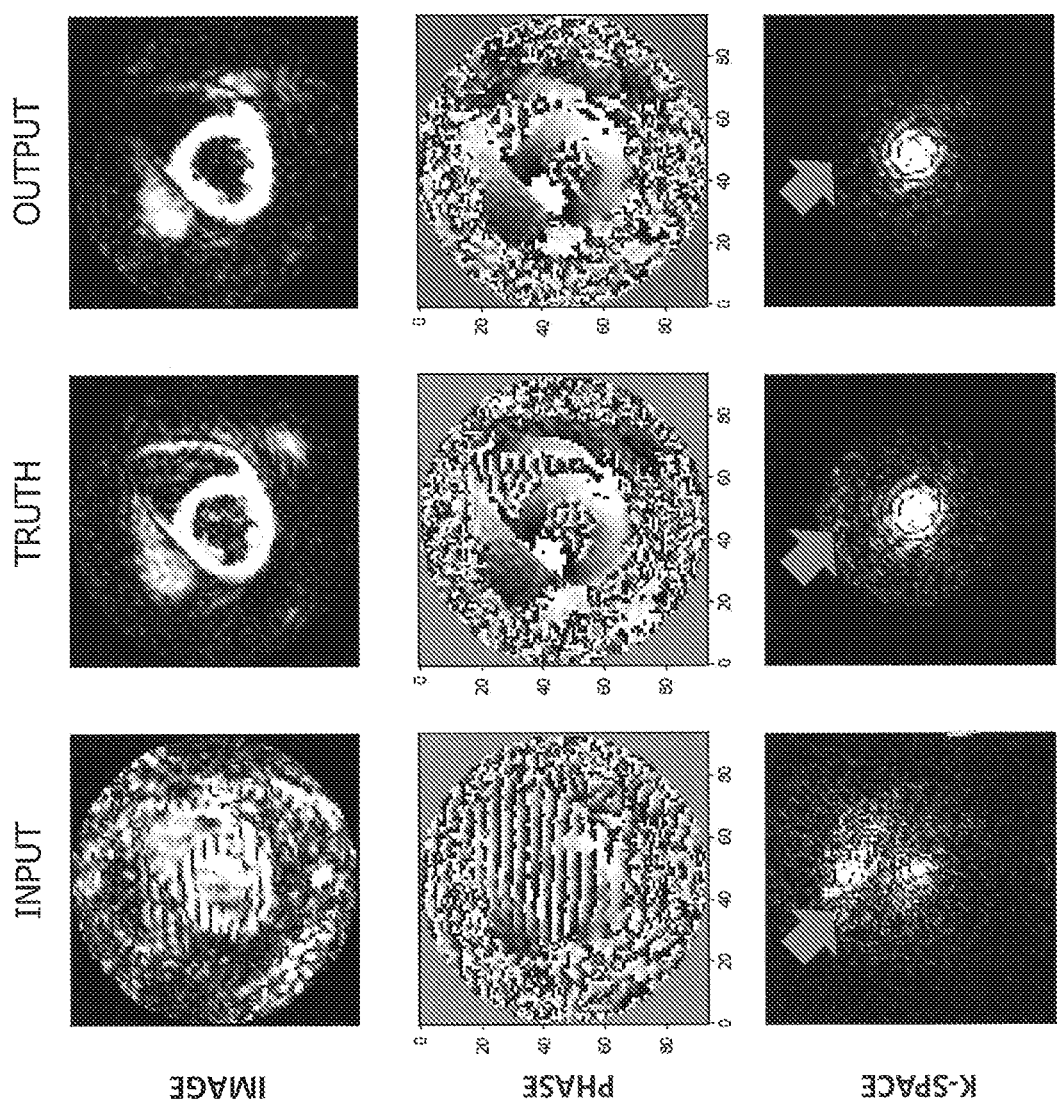
FIG. 9 is one example result of MRI image data with suppressed artifact generation (i.e., suppressed T1-relaxation) as disclosed herein, including background, x direction, and y direction encoding.

In some embodiments as shown in FIGS. 7, 8 and 9, the original frames, additional original frames, and/or the new original frames as well as ground truth frames are in the k-t space. The original frames, additional original frames, and/or the new original frames may also be in the image space. Regardless of the domain, the original frames, additional original frames, and/or the new original frames include image data from MRI operations acquired using two-dimensional displacement encoding. In this sense, the original frames, the additional original frames, and/or the new original frames include at least one of displacement encoded background data, displacement encoded x-direction data, and displacement encoded y-direction data. Furthermore, the original frames, the additional original frames, and/or the new original frames include respective data acquired using balanced displacement encoding. Also, the original frames, the additional original frames, and/or the new original frames the respective data acquired using simple displacement encoding. The terms original frames, additional original frames, and/or new original frames are not limiting of this disclosure but represent identifiers of frames of image data that have a respective format and/or artifact content and/or STE content.

As another non-limiting option, the original frames, additional original frames, and/or the new original frames include respective data acquired using three-dimensional displacement encoding. Certain pre-processing steps may be useful, particularly prior to the establishing the training set of data, and those pre-processing steps may include, among others, applying spatial transformation protocols, based on the training set, to each respective original frame of MRI image data. Similarly, pre-processing the training set and the test set of data may include gridding respective original frames of image data into Cartesian coordinates.

As noted above, one aspect of this disclosure includes correcting MRI data with a single pass of image acquisition as illustrated by the single set of data 610 in FIG. 6. In this regard, a method of this disclosure includes using a convolutional neural network (CNN) 400 to suppress T1 relaxation echo artifacts and/or stimulated anti-echo artifacts in MRI images by acquiring a plurality of original frames 610 of stimulated-echo images or displacement-encoded stimulated echo (DENSE) cine frames of MRI data of a subject and selecting a CNN 500 that has been trained to suppress artifacts in the MRI images. By using the trained CNN, the concepts of this disclosure include applying, in a single pass, the original frames of image data to the selected CNN, and receiving, from the single pass through the CNN, output complex image data 695 with suppressed artifacts.

Figure 10:
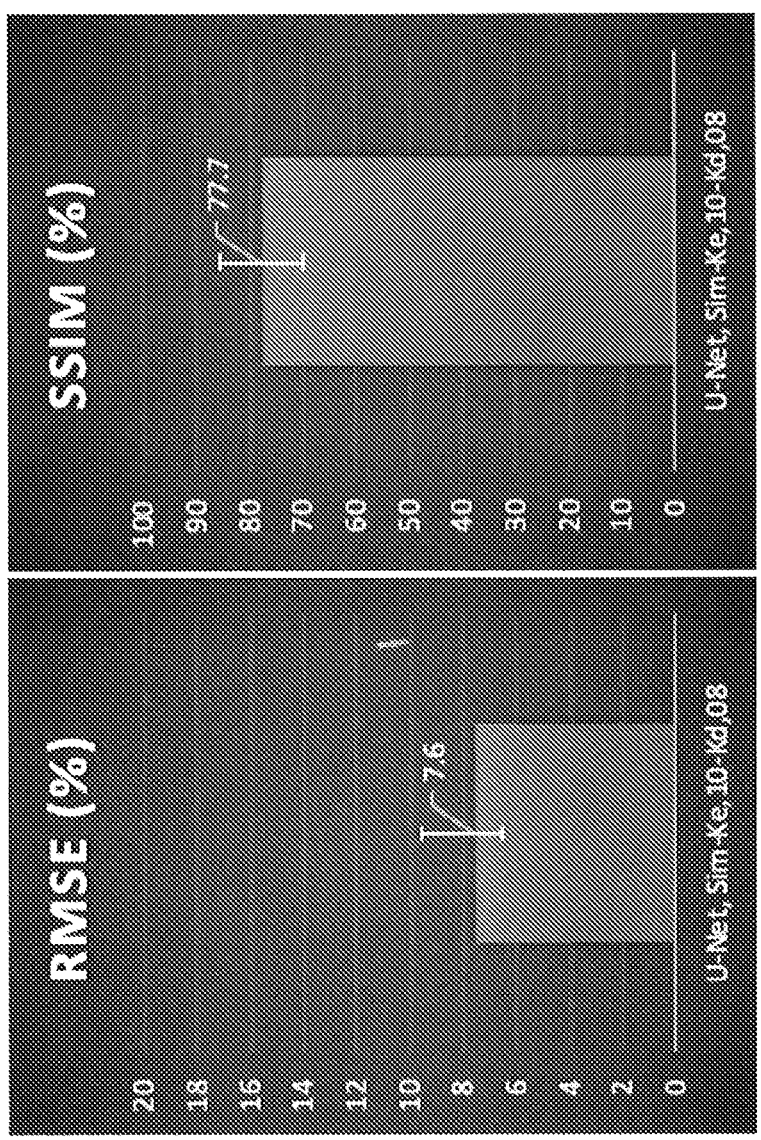
FIG. 10 is an example error measurement that was used to train a convolutional neural network according to this disclosure.
Figures 11A, 11B:
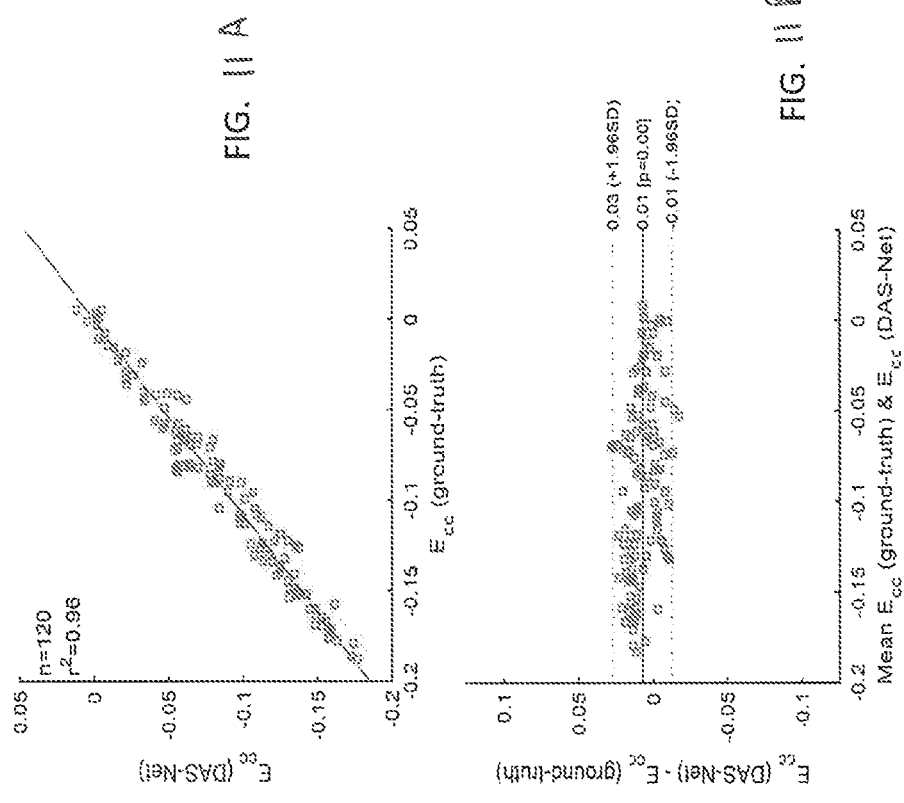
FIG. 11A is a schematic plot of an example myocardial strain analysis of post acquisition and artifact suppressed image data error signals using the techniques of this disclosure.
FIG. 11B is a schematic plot of an example myocardial strain analysis of post acquisition and artifact suppressed image data error signals using the techniques of this disclosure.
Figure 12:
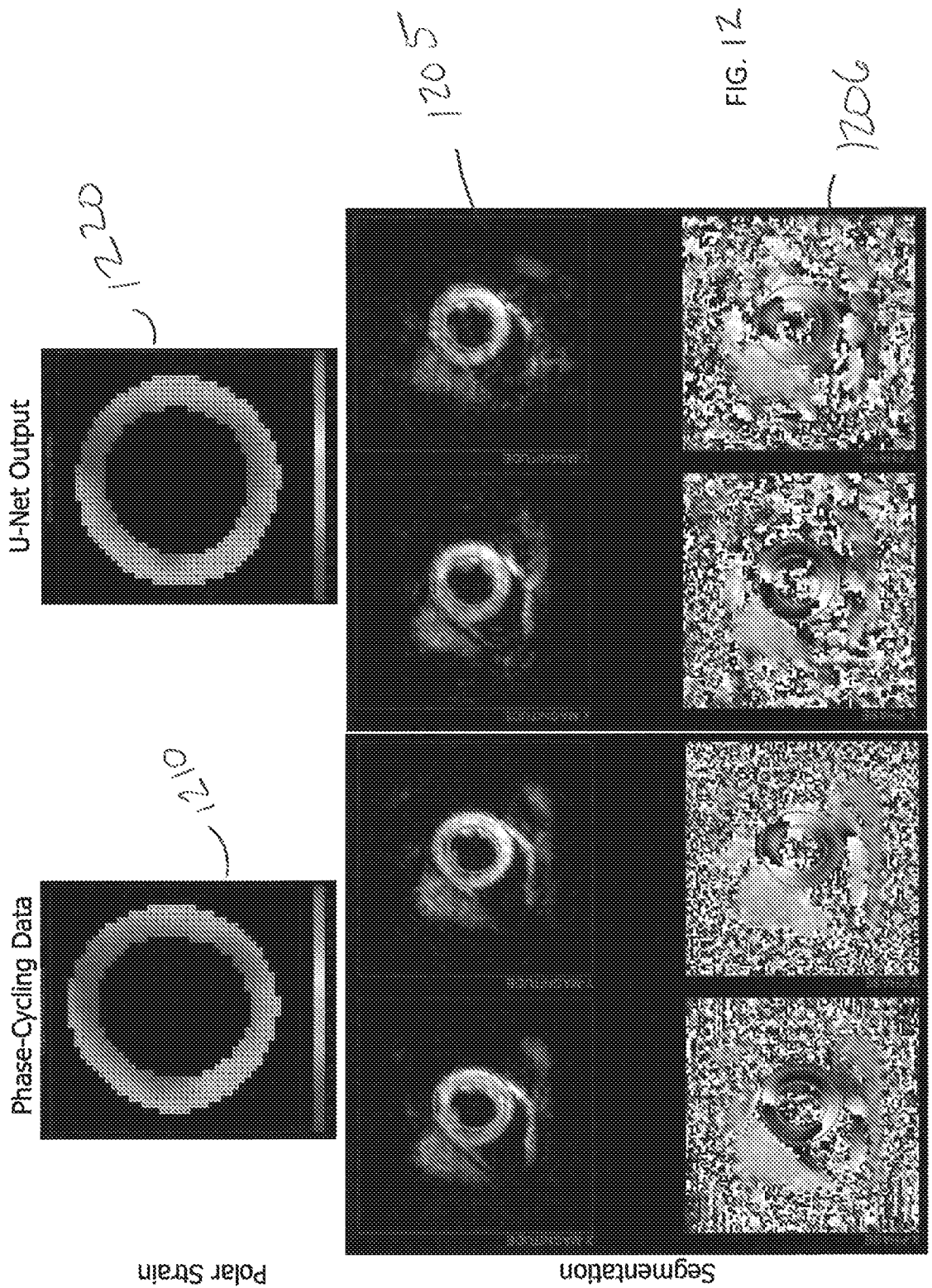
FIG. 12 is an example of myocardial segmentation and polar strain results achieved with concepts disclosed herein.
Figures 13A, 13B:
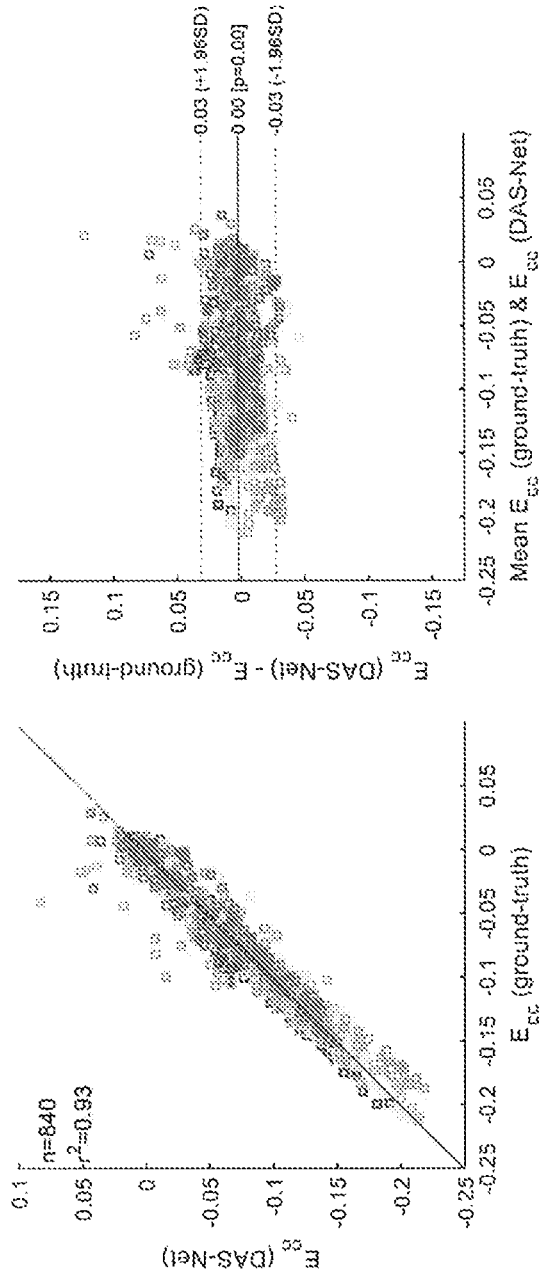
FIG. 13A is a schematic plot of an example myocardial strain analysis of post acquisition and artifact suppressed image data error signals using the techniques of this disclosure.
FIG. 13B is a schematic plot of an example myocardial strain analysis of post acquisition and artifact suppressed image data error signals using the techniques of this disclosure.

In a more general sense, training a CNN for the goals expressed herein includes useful steps in its own right. A method of training a convolutional neural network (CNN) 500 to suppress T1 relaxation echo artifacts and/or stimulated anti-echo artifacts in MRI images may, therefore, include acquiring a plurality of original frames 510, 550 of displacement encoded stimulated echo (DENSE) cine frames of MRI image data for a subject and selecting a training set 510 of complex image data from the original frames of DENSE cine frames. The CNN is pre-loaded with earlier computed ground-truth complex image data 550 from the training set. With those aspects in place, training the CNN includes applying the training set of complex image data to the CNN and calculating a two-channel training output 578 of complex output image data. The training aspects of this disclosure are designed to use the complex output image data and the ground truth complex image data to calculate an error signal 585 as training feedback 579 to establish a trained CNN 500. The error signal may be any one of several error signals, including but limited to, calculating the error signal as a root mean squared error signal, or absolute difference, and iteratively calculating a series of error signals for multiple training sets for continuously training the CNN. The results of one simulation calculating the error signals for root mean square error (RMSE) and a structural similarity index (SSIM) has been calculated for a sample CNN 500 as shown in FIG. 10. The results of error based strain analysis are plotted as shown in FIGS. 11A and 11B. In FIG. 12, polar strain results for phase cycling data 1210 and U-Net output 1220 are illustrated and show the efficiencies of the method herein. The segmentation clarity in both the magnitude domain 1205 and the phase domain 1206 is significantly improved over earlier methods. The associated error plots are provided in FIGS. 13A and 13B.

The methods disclosed herein may be implemented as a computerized system that uses software enabled by a processor to suppress artifacts in MRI images. Accordingly, a computer implemented system of using a convolutional neural network (CNN) to suppress artifacts in MRI images includes a computer comprising a processor and memory storing software configured to perform the steps described above, including but not limited to acquiring a plurality of original frames of displacement encoded stimulated echo (DENSE) cine frames of MRI image data of a subject and selecting a training set of complex image data from the original frames of DENSE cine frames. A computer implementing the CNN for the purposes herein may store, in its memory, previously computed ground-truth complex image data from the training set. In this way, the system embodiments described herein are configured for training the CNN by applying the training set of complex image data to the CNN and calculating a two-channel training output of complex output image data. Finally, the system uses the complex output image data and the ground truth complex image data to calculate an error signal, including but not limited to, a mean squared error, as training feedback to establish a trained CNN.

The same system or a different computer system having access to the CNN may test live data by selecting a testing set of complex input image data from the original frames of DENSE cine frames, applying the testing set of complex input image data to the trained CNN, and receiving a two-channel set of testing output complex image data with suppressed artifacts. The systems implementing the operations described herein may be connected as series of computers on a data network connecting numerous computers to other remote computer hardware for data transmission.

CONCLUSION

The specific configurations, choice of materials and the size and shape of various elements can be varied according to particular design specifications or constraints requiring a system or method constructed according to the principles of the disclosed technology. Such changes are intended to be embraced within the scope of the disclosed technology. The presently disclosed embodiments, therefore, are considered in all respects to be illustrative and not restrictive. The patentable scope of certain embodiments of the disclosed technology is indicated by the appended claims, rather than the foregoing description.

LIST OF REFERENCES

[1] Simpson, R. M. et al., JMRI 2013; 37(3): 576-599.
[2] Spottiswoode, B. S. et al., Med. Image Anal. 2009, 13: 105-15
[3] Young, A. A. et al., Magnetic Resonance in Medicine 2012, 67(6): 1590-1599.
[4] Spottiswoode, B. S. et al, IEEE Trans. Med. Imaging 2007; 26:15-20.
[5] Gilliam, A. D. et al., IEEE Trans. Med. Imaging 2012, 31: 1669-81.
[6] Xu, W. et al., IEEE Trans. on Geoscience and Remote Sensing 1999, 37:124-34.

What is claimed is:

1. A method of training a convolutional neural network (CNN) to suppress T1 relaxation echo artifacts and/or stimulated anti-echo artifacts in MRI images, the method comprising:
    acquiring a plurality of original frames of displacement encoded stimulated echo (DENSE) cine frames of MRI image data for a subject;
    selecting a training set of complex image data from the original frames of DENSE cine frames;
    computing ground-truth complex image data from the training set; and
    training the CNN by:
        applying the training set of complex image data to the CNN and calculating a two-channel training output of complex output image data, and
        using the complex output image data and the ground truth complex image data, calculating an error signal as training feedback to establish a trained CNN.

2. The method of training according to claim 1, further comprising calculating the error signal as a root mean squared error signal, or absolute difference and iteratively calculating a series of error signals for multiple training sets for continuously training the CNN.

3. A method of using a convolutional neural network (CNN) to separate signals and suppress artifacts in MRI images, the method comprising:
    acquiring first data comprising a stimulated echo and a T1 relaxation echo;
    acquiring second data comprised of a second stimulated echo, a second T1 relaxation echo, and a second stimulated anti-echo;
    acquiring at least one of original frames comprising the stimulated echo and the T1 relaxation echo;

acquiring at least one of additional original frames comprising a stimulated echo, a T1 relaxation echo, and a stimulated anti-echo;

acquiring a plurality of new original frames of displacement encoded stimulated echo (DENSE) cine frames of MRI image data of a subject;

selecting a training set of complex image data from the original frames, additional original frames, and/or the new additional frames;

computing ground-truth complex image data from the training set;

training the CNN by:
  applying the training set of complex image data to train the CNN and calculating a two-channel training output of complex output image data, and
  using the complex output image data and the ground truth complex image data, calculating a loss function as training feedback to establish a trained CNN;

testing the trained CNN by:
  selecting a testing set of complex input image data from the original frames, additional original frames, and/or the new additional frames,
  applying the testing set of complex input image data to the trained CNN, and
  receiving a two-channel set of testing output complex image data with suppressed artifacts.

4. The method of claim 3, wherein:
said training set comprises imaginary component training data frames and real component training data frames of the complex image data;
said ground truth complex image data comprises imaginary component ground truth data frames and real component ground truth data frames;
said two-channel output comprises real output image data and imaginary output image data;
said testing set comprises imaginary component test data frames and real component test data frames of the complex image data; and
said test output complex image data comprises imaginary component test output data frames and real component test output data frames.

5. The method of claim 3, wherein the original frames, additional original frames, and/or the new original frames are in k-t space.

6. The method of claim 3, wherein the original frames, additional original frames, and/or the new original frames are in image space.

7. The method of claim 3, wherein the CNN is a U-Net.

8. The method of claim 3, wherein computing ground-truth complex image data from the training set comprises applying phase cycling techniques to the training set.

9. The method of claim 8, wherein the phase cycling techniques comprise adding and/or subtracting the artifacts from a sequence of target training images.

10. The method of claim 3, wherein said original frames, additional original frames, and/or the new original frames comprise data acquired using two-dimensional displacement encoding.

11. The method of claim 10, wherein said original frames, said additional original frames, and/or said new original frames comprise at least one of displacement encoded background data, displacement encoded x-direction data, and displacement encoded y-direction data.

12. The method of claim 3, wherein said original frames, said additional original frames, and/or said new original frames comprise respective data acquired using balanced displacement encoding.

13. The method of claim 3, wherein said original frames, said additional original frames, and/or said new original frames comprise respective data acquired using simple displacement encoding.

14. The method of claim 3, wherein said original frames, said additional original frames, and/or said new original frames comprise respective data acquired using three-dimensional displacement encoding.

15. The method of claim 3, further comprising applying spatial transformation protocols, based on the training set, to each respective original frame of MRI image data.

16. The method of claim 3, further comprising gridding respective original frames of image data into Cartesian coordinates.

17. A computer implemented system of using a convolutional neural network (CNN) to suppress artifacts in MRI images, the system comprising:
  a computer comprising a processor and memory storing software configured to perform the following steps:
    acquiring a plurality of original frames of displacement encoded stimulated echo (DENSE) cine frames of MRI image data of a subject;
    selecting a training set of complex image data from the original frames of DENSE cine frames;
    computing ground-truth complex image data from the training set;
    training the CNN by:
      applying the training set of complex image data to the CNN and calculating a two channel training output of complex output image data, and
      using the complex output image data and the ground truth complex image data, calculating a mean squared error as training feedback to establish a trained CNN;
    testing the trained CNN by:
      selecting a testing set of complex input image data from the original frames of DENSE cine frames,
      applying the testing set of complex input image data to the trained CNN, and
      receiving a two-channel set of testing output complex image data with suppressed artifacts.

18. The system according to claim 17, further comprising:
a data network connecting the computer to remote computer hardware for data transmission.

19. The system according to claim 17, wherein the software stored in the memory comprises a UNET convolutional neural network configured to receive complex data.

* * * * *